(12) United States Patent
Chang et al.

(10) Patent No.: US 10,637,421 B2
(45) Date of Patent: Apr. 28, 2020

(54) AUDIO PLAYBACK DEVICE AND AUDIO CONTROL CIRCUIT OF THE SAME

(71) Applicant: Realtek Semiconductor Corporation, Hsinchu (TW)

(72) Inventors: Cheng-Pin Chang, Taipei (TW); Tsung-Peng Chuang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 59 days.

(21) Appl. No.: 16/001,929

(22) Filed: Jun. 6, 2018

(65) Prior Publication Data
US 2018/0358943 A1 Dec. 13, 2018

(30) Foreign Application Priority Data
Jun. 7, 2017 (TW) .............................. 106118899 A

(51) Int. Cl.
*H04R 1/28* (2006.01)
*H03G 3/30* (2006.01)
*H03G 3/02* (2006.01)
*H03G 7/00* (2006.01)
*H04R 3/04* (2006.01)

(52) U.S. Cl.
CPC ............. *H03G 3/02* (2013.01); *H03G 3/3005* (2013.01); *H03G 7/002* (2013.01); *H04R 1/2803* (2013.01); *H04R 3/04* (2013.01); *H04R 2430/01* (2013.01)

(58) Field of Classification Search
CPC ........ H03G 3/02; H03G 7/002; H03G 3/3005; H04R 1/2803; H04R 2430/01; H04R 3/04

USPC ... 381/109, 58, 59, 104, 129, 164, 400, 406, 381/55, 120
See application file for complete search history.

(56) References Cited

U.S. PATENT DOCUMENTS

| | | | | |
|---|---|---|---|---|
| 2002/0118841 A1* | 8/2002 | Button | ..................... | H04R 3/00 381/55 |
| 2004/0086140 A1* | 5/2004 | Fedigan | ................... | H04R 3/00 381/96 |
| 2012/0288120 A1* | 11/2012 | Nussbaum | .............. | H02M 1/32 381/107 |

(Continued)

FOREIGN PATENT DOCUMENTS

| | | |
|---|---|---|
| CN | 102711016 A | 10/2012 |
| CN | 105549946 A | 5/2016 |
| CN | 106792366 A | 5/2017 |

*Primary Examiner* — Paul Kim
*Assistant Examiner* — Con P Tran
(74) *Attorney, Agent, or Firm* — CKC & Partners Co., LLC

(57) ABSTRACT

An audio playback device that includes an audio receiver module, a loudspeaker module and an audio control circuit is provided. The audio control circuit includes an interface and a gain adjusting module. The interface receives an audio signal from an audio source. Under a first operation mode, the audio signal is transmitted only to the audio receiver module to be playback. Under a second operation mode, the audio signal is transmitted to the audio receiver module and to the loudspeaker module to be playback. The gain adjusting module includes a temperature sensing circuit to sense a temperature of the audio receiver module and a gain adjusting circuit electrically coupled between the audio interface and the audio receiver module to adjust a gain of the audio signal according to the temperature.

18 Claims, 2 Drawing Sheets

(56) References Cited

U.S. PATENT DOCUMENTS

| | | | |
|---|---|---|---|
| 2015/0215704 A1* | 7/2015 | Magrath | H04R 9/022 |
| | | | 381/55 |
| 2017/0038265 A1* | 2/2017 | Abdelmoneum | G01K 15/005 |
| 2017/0164127 A1* | 6/2017 | Gautama | H03G 3/3005 |
| 2017/0373657 A1* | 12/2017 | Mendes | H03G 3/12 |
| 2018/0077491 A1* | 3/2018 | Butler | H04B 3/542 |

* cited by examiner

AUDIO PLAYBACK DEVICE AND AUDIO CONTROL CIRCUIT OF THE SAME

RELATED APPLICATIONS

This application claims priority to Taiwan Application Serial Number 106118899, filed Jun. 7, 2017, which is herein incorporated by reference.

BACKGROUND

Field of Disclosure

The present disclosure relates to an audio playback technology. More particularly, the present disclosure relates to an audio playback device and an audio control circuit of the same.

Description of Related Art

The handheld electronic devices, e.g. the smartphones, in the market mostly use a single audio receiver module to playback the audio signal from a phone call and use a single loudspeaker module to playback the audio signal from multimedia sources. However, since the size of the handheld electronic devices gradually shrinks due to the progress of the manufacturing process, the size of the loudspeaker module and the power of the driving chip decrease as well. The loudspeaker may not be able to playback the audio signal with a sufficient volume. Further, when only a single loudspeaker is disposed, the stereo sound effect is not easy to be established such that a better playback effect is not easy to be accomplished.

Accordingly, what is needed is an audio playback device and an audio control circuit of the same to address the issues mentioned above.

SUMMARY

An aspect of the present disclosure is to provide an audio control circuit that includes an interface and a first gain adjusting module. The interface is configured to receive an audio signal from an audio source, to transmit the audio signal only to an audio receiver module to be playback under a first operation mode, and to transmit the audio signal to the audio receiver module and to a loudspeaker module to be playback under a second operation mode. The first gain adjusting module includes a first temperature sensing circuit and a first gain adjusting circuit. The first temperature sensing circuit is configured to sense a temperature of the audio receiver module. The first gain adjusting circuit is electrically coupled between the interface and the audio receiver module and is configured to adjust a first gain of the audio signal according to the temperature of the audio receiver module.

Another aspect of the present disclosure is to provide an audio playback device that includes an audio receiver module, a loudspeaker module and an audio control circuit. The audio control circuit includes an interface and a first gain adjusting module. The interface is configured to receive an audio signal from an audio source, to transmit the audio signal only to the audio receiver module to be playback under a first operation mode, and to transmit the audio signal to the audio receiver module and to the loudspeaker module to be playback under a second operation mode. The first gain adjusting module includes a first temperature sensing circuit and a first gain adjusting circuit. The first temperature sensing circuit is configured to sense a temperature of the audio receiver module. The first gain adjusting circuit is electrically coupled between the interface and the audio receiver module and is configured to adjust a first gain of the audio signal according to the temperature of the audio receiver module.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
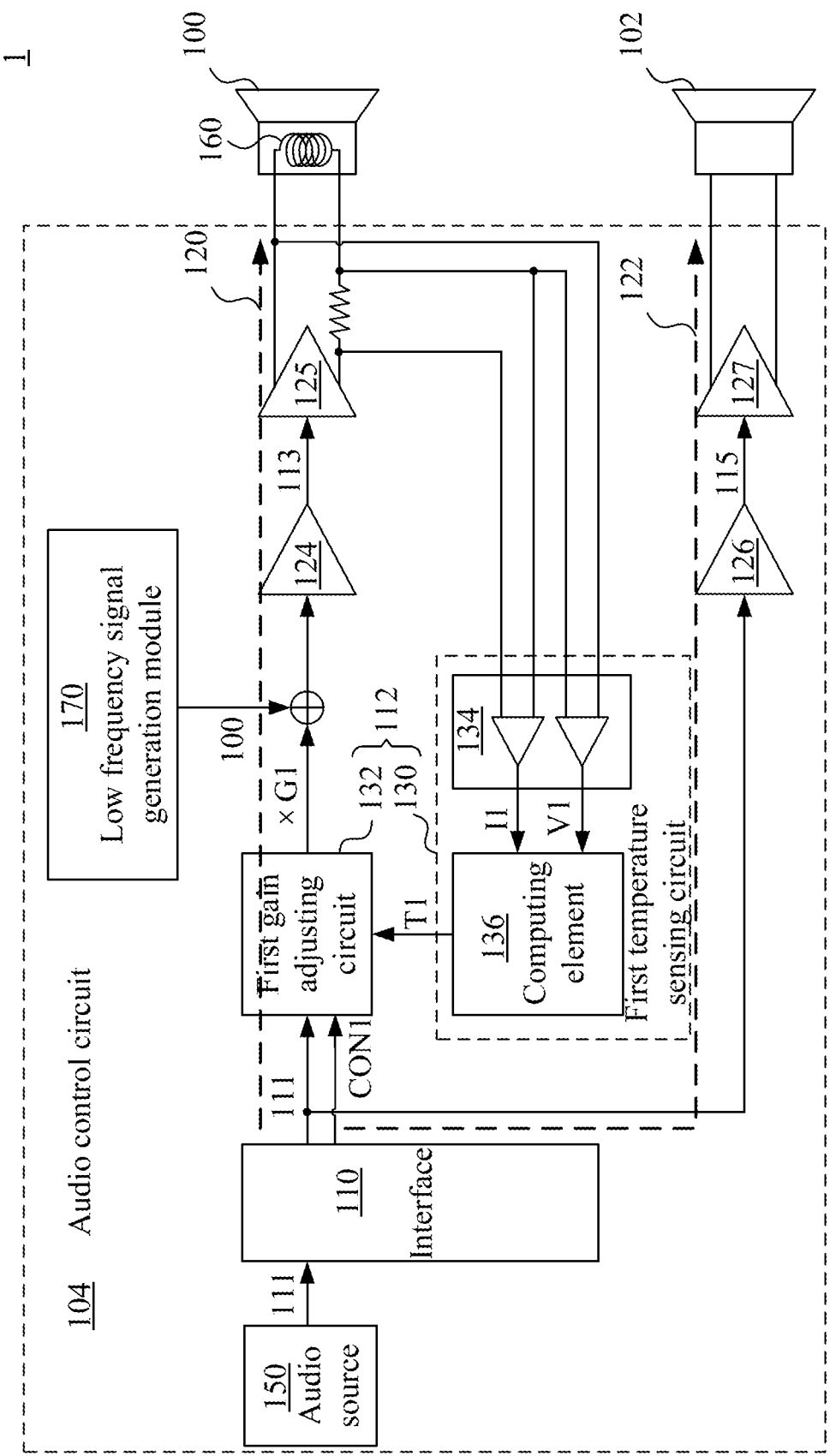
FIG. 1 is a block diagram of an audio playback device in an embodiment of the present invention.

Reference is now made to FIG. 1. FIG. 1 is a block diagram of an audio playback device 1 in an embodiment of the present invention. The audio playback device 1 includes an audio receiver module 100, a loudspeaker module 102 and an audio control circuit 104.

In an embodiment, the audio playback device 1 is disposed in a handheld electronic device (not illustrated) such as, but not limited to a smartphone or a tablet personal computer (PC).

In an embodiment, the audio receiver module 100 is disposed on the main body of the audio playback device 1. The audio receiver module 100 is configured to playback the audio signal under a first operation mode such as, but not limited to a non-loudspeaker mode that uses the audio receiver to playback the audio signal. The user of the audio playback device 1 can keep the ear close to the audio receiver module 100 to listen to the audio signal. In an embodiment, the loudspeaker module 102 is also disposed on the main body of the audio playback device 1. The loudspeaker module 102 is configured to playback the audio signal under a second operation mode such as, but not limited to a loudspeaker mode that uses the loudspeaker to playback the audio signal. The user of the audio playback device 1 can keep a distance from the loudspeaker module 102 to listen to the audio signal.

The audio control circuit 104 includes an interface 110 and a first gain adjusting module 112.

The interface 110 is configured to receive an audio signal 111 from an audio source 150. In an embodiment, the audio source 150 can be such as, but not limited to a system-on-a-chip (SoC) used to process the audio signals. The interface 110 can be electrically coupled to the audio source 150 through different transmission ports and corresponding transmission paths to receive the audio signal 111.

In an embodiment, the interface 110 is electrically coupled to the audio receiver module 100 and the loudspeaker module 102 through a first path 120 and a second path 122 respectively. The interface 110 can transmit the audio signal 111 to the audio receiver module 100 and the loudspeaker module 102 through the first path 120 and the second path 122 respectively.

In an embodiment, the first path 120 includes a first digital-to-analog converter (DAC) 124 configured to convert the audio signal 111 to a first analog audio signal 113. In an embodiment, the first path 120 can selectively include a first amplifier 125 to further amplify the first analog audio signal 113 such that the audio receiver module 100 substantially playbacks the amplified first analog audio signal 113.

The second path 122 includes a second DAC 126 configured to convert the audio signal 111 to a second analog audio signal 115. In an embodiment, the second path 122 can selectively include a second amplifier 127 to further amplify the second analog audio signal 115 such that the loudspeaker module 102 substantially playbacks the amplified second analog audio signal 115.

In an embodiment, under the first operation mode, the interface 110 transmits the audio signal 111 only through the first path 120 such that the audio signal 111 is converted by the first DAC 124 and amplified by the first amplifier 125 and is further played by the audio receiver module 100. Under such a condition, the loudspeaker 102 does not playback any audio signal.

Under the second operation mode, the interface 110 transmits the audio signal 111 through the first path 120 such that the audio signal 111 is converted by the first DAC 124, amplified by the first amplifier 125 and further played by the audio receiver module 100. Furthermore, the interface 110 transmits the audio signal 111 through the second path 122 such that the audio signal 111 is converted by the second DAC 126, amplified by the second amplifier 127 and further played by the loudspeaker module 102. Under such a condition, the audio receiver module 100 and the loudspeaker module 102 simultaneously playback the audio signal 111. In an embodiment, each of the audio receiver module 100 and the loudspeaker module 102 playbacks one of the left channel audio signal and the right channel audio signal respectively.

The first gain adjusting module 112 is disposed corresponding to the first path 120 and is configured to adjust a first gain G1 of the audio signal 111 on the first path 120. The first gain adjusting module 112 includes a first temperature sensing circuit 130 and a first gain adjusting circuit 132. The first temperature sensing circuit 130 is configured to sense a temperature T1 of the audio receiver module 100. Further, the first gain adjusting circuit 132 is electrically coupled between the interface 110 and the audio receiver module 100 and is configured to adjust the first gain G1 of the audio signal 111 according to the temperature T1 of the audio receiver module 100.

In an embodiment, the audio receiver module 100 includes a sound coil 160 having two terminals electrically coupled to the first path 120. The first temperature sensing circuit 130 includes an analog-to-digital converting (ADC) element 134 and a computing element 136. The analog-to-digital converting element 134 is configured to perform an analog-to-digital conversion on a coil current I1 and a coil voltage V1 between the two terminals of the sound coil 160. The computing element 136 further computes the coil resistance R(T1) accordingly and further computes the temperature T1 according to the coil resistance R(T1) and a coil temperature coefficient α of the sound coil 160.

In an embodiment, the computing element 136 of the first temperature sensing circuit 130 performs the computing of the temperature according to the following equation:

$$T1 = (R(T1)/R(T_0) + \alpha^{-1} + T_0 - \alpha^{-1})$$

$T_0$ is the room temperature such as, but not limited to 25 degrees. $R(T_0)$ is the coil resistance under the room temperature.

In an embodiment, the audio control circuit 104 further includes a low frequency signal generation module 170 configured to generate a low frequency signal LOW and transmit the low frequency signal LOW to the audio receiver module 100 through the first path 120. The computing element 136 further performs a low-pass filtering on the coil current I1 and the coil voltage V1 after the analog-to-digital conversion to retrieve a part related to the low frequency signal LOW to compute the coil resistance R(T1). In an embodiment, the low frequency signal LOW is a signal of such as, but not limited to 10 Hertz.

In an embodiment, when the temperature T1 is smaller than a threshold temperature tolerable by the sound coil 160, the first gain adjusting circuit 132 keeps increasing the first gain G1 to a predetermined value. When the temperature T1 is larger than or equal to the threshold temperature, the first gain adjusting circuit 132 stops increasing the first gain G1. In an embodiment, the predetermined value is determined according to the required channel volume of the audio receiver module 100.

In an embodiment, the increasing or decreasing of the gain performed by the first gain adjusting circuit 132 can be activated by receiving a channel volume control signal CON1 transmitted by the interface 110.

The difference between the volumes of the audio signal generated by the audio receiver module 100 under the first operation mode and the second operation mode is large. As a result, when the second operation mode (loudspeaker mode) is operated, the volume can be increased as large as possible according to the control of the first gain adjusting module 112 once the volume is within the range tolerable by the audio receiver module 100. The volume generated by the audio receiver module 100 can thus be close to the volume generated by the loudspeaker module 102.

The advantage of the present invention is to playback the audio signal by using the audio receiver module 100 and the loudspeaker module 102 simultaneously under the loudspeaker mode based on the disposition of the audio control circuit 104. Further, by disposing the first gain adjusting module 112, the gain of the audio receiver module 100 can be increased within a tolerable range thereof to accomplish a better playback effect.

Figure 2:
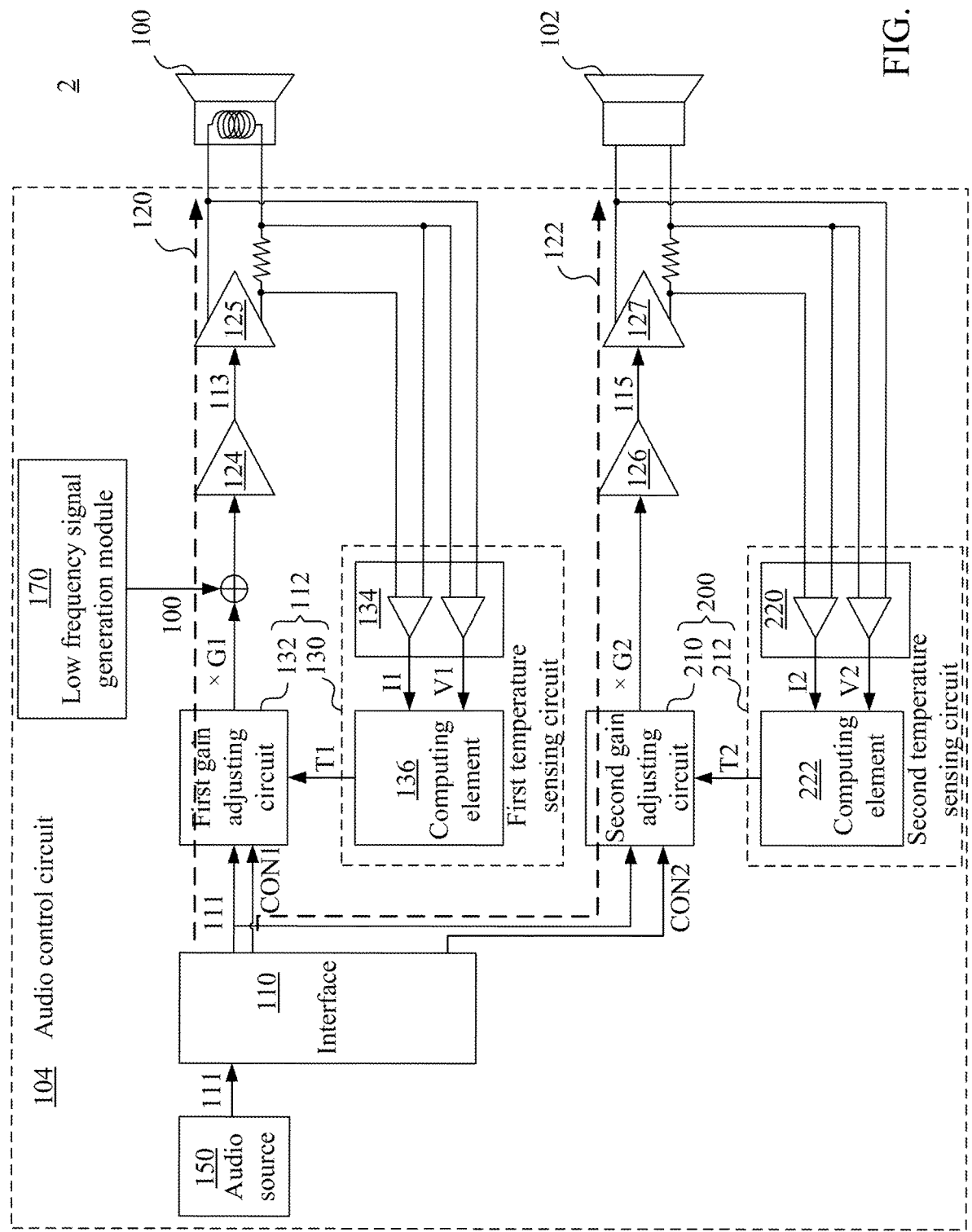
FIG. 2 is a block diagram of the audio playback device in an embodiment of the present invention.

Reference is now made to FIG. 2. FIG. 2 is a block diagram of the audio playback device 2 in an embodiment of the present invention. Similar to the audio playback device 1 illustrated in FIG. 1, the audio playback device 2 in FIG. 2 includes the audio receiver module 100, the loudspeaker module 102 and an audio control circuit 104.

The audio control circuit 104 also includes the interface 110 and the first gain adjusting module 112 in FIG. 1. The structure and the function thereof are identical to those illustrated in FIG. 1. As a result, the detail of the interface 110 and the first gain adjusting module 112 is not described herein. In the present embodiment, the audio control circuit 104 further includes a second gain adjusting module 200.

The second gain adjusting module 200 is disposed corresponding to the second path 122 and is configured to adjust a second gain G2 of the audio signal 111 on the second path 122. The second gain adjusting module 200 includes a second temperature sensing circuit 210 and a second gain adjusting circuit 212. The second temperature sensing circuit 210 is configured to sense a loudspeaker temperature T2 of the loudspeaker module 102. Further, the second gain adjusting circuit 212 is electrically coupled between the interface 110 and the loudspeaker module 102 and is configured to adjust the second gain G2 of the audio signal 111 according to the loudspeaker temperature T2 of the loudspeaker module 102.

Similarly to the first temperature sensing circuit 130 illustrated in FIG. 1, the second temperature sensing circuit 210 includes an analog-to-digital converting (ADC) element 220 and a computing element 222. The analog-to-digital converting element 220 is configured to perform an analog-to-digital conversion on a coil current 12 and a coil voltage V2 of the loudspeaker module 102. The computing element 222 further computes the coil resistance R(T2) accordingly and further computes the loudspeaker temperature T2 according to the coil resistance R(T2) and a related temperature coefficient of the loudspeaker module 102. In an embodiment, the computing of the temperature of the second temperature sensing circuit 210 is identical to that of the first temperature sensing circuit 130. The detail of the computing is therefore not described herein.

In an embodiment, when the loudspeaker temperature T2 is smaller than a threshold temperature tolerable by the loudspeaker module 102, the second gain adjusting circuit 212 keeps increasing the second gain G2 to a predetermined value. When the loudspeaker temperature T2 is larger than or equal to the threshold temperature, the second gain adjusting circuit 212 stops increasing the second gain G2. In an embodiment, the predetermined value is determined according to the required channel volume of the loudspeaker module 102.

In an embodiment, the increasing or decreasing of the gain performed by the second gain adjusting circuit 212 can be activated by receiving a channel volume control signal CON2 transmitted by the interface 110.

By disposing the first gain adjusting module 112 and the second gain adjusting module 200, the audio playback device 2 can control the volumes of the audio receiver module 100 and the loudspeaker 102 within the tolerable range thereof to accomplish a better playback effect.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An audio control circuit comprising:
    an interface configured to receive an audio signal from an audio source, to transmit the audio signal only to an audio receiver module to be playback under a first operation mode, and to transmit the audio signal to the audio receiver module and to a loudspeaker module to be playback under a second operation mode; and
    a first gain adjusting module comprising:
        a first temperature sensing circuit configured to sense a temperature of the audio receiver module; and
        a first gain adjusting circuit electrically coupled between the interface and the audio receiver module and configured to adjust a first gain of the audio signal according to the temperature of the audio receiver module.

2. The audio control circuit of claim 1, wherein the interface transmits the audio signal to the audio receiver module to be playback through a first path under the first operation mode, and the interface transmits the audio signal to the audio receiver module and to the loudspeaker module to be playback through the first path and the second path respectively under the second operation mode, wherein the first gain adjusting circuit is disposed corresponding to the first path.

3. The audio control circuit of claim 2, wherein the first path further comprise a first digital-to-analog converter configured to convert the audio signal to a first analog audio signal such that the audio receiver module plays the first analog audio signal, and the second path further comprise a second digital-to-analog converter configured to convert the audio signal to a second analog audio signal such that the loudspeaker module plays the second analog audio signal.

4. The audio control circuit of claim 3, wherein the audio receiver module comprises a sound coil having two terminals electrically coupled to the first path, the first temperature sensing circuit is configured to receive a coil current and a coil voltage of the two terminals of the sound coil to compute a coil resistance and compute the temperature according to the coil resistance and a coil temperature coefficient of the sound coil.

5. The audio control circuit of claim 4, wherein the first temperature sensing circuit comprises:
    an analog-to-digital converting element to perform an analog-to-digital conversion on the coil current and the coil voltage; and
    a computing element to compute the coil resistance according to the coil current and the coil voltage.

6. The audio control circuit of claim 5, further comprising a low frequency signal generation module configured to generate a low frequency signal and transmit the low frequency signal to the audio receiver module through the first path, and the computing element further performs a low-pass filtering on the coil current and the coil voltage after the analog-to-digital conversion to retrieve a part related to the low frequency signal to compute the coil resistance.

7. The audio control circuit of claim 2, further comprising a second gain adjusting module disposed corresponding to the second path, wherein the first gain adjusting module and the second gain adjusting module control volumes of the audio receiver module and the loudspeaker module according to a channel volume control signal, and the second gain adjusting module comprises:
    a second temperature sensing circuit configured to sense a loudspeaker temperature of the loudspeaker module; and
    a second gain adjusting circuit electrically coupled between the interface and the loudspeaker module and configured to adjust a second gain of the audio signal according to the loudspeaker temperature of the loudspeaker module.

8. The audio control circuit of claim 1, wherein when the temperature is smaller than a threshold temperature, the first gain adjusting module increases the first gain to a predetermined value, and when the temperature is larger than or equal to the threshold temperature, the first gain adjusting module stops to increase the first gain.

9. The audio control circuit of claim 1, wherein each of the audio receiver module and the loudspeaker module plays one of a left channel audio signal and a right channel audio signal.

10. An audio playback device comprising:
    an audio receiver module;
    a loudspeaker module; and
    an audio control circuit comprising:
        an interface configured to receive an audio signal from an audio source, to transmit the audio signal only to the audio receiver module to be playback under a first operation mode, and to transmit the audio signal to the audio receiver module and to the loudspeaker module to be playback under a second operation mode; and a first gain adjusting module comprising:
- a first temperature sensing circuit configured to sense a temperature of the audio receiver module; and
- a first gain adjusting circuit electrically coupled between the interface and the audio receiver module and configured to adjust a first gain of the audio signal according to the temperature of the audio receiver module.

11. The audio playback device of claim 10, wherein the interface transmits the audio signal to the audio receiver module to be playback through a first path under the first operation mode, and the interface transmits the audio signal to the audio receiver module and to the loudspeaker module to be playback through the first path and the second path respectively under the second operation mode, wherein the first gain adjusting circuit is disposed corresponding to the first path.

12. The audio playback device of claim 11, wherein the first path further comprise a first digital-to-analog converter configured to convert the audio signal to a first analog audio signal such that the audio receiver module plays the first analog audio signal, and the second path further comprise a second digital-to-analog converter configured to convert the audio signal to a second analog audio signal such that the loudspeaker module plays the second analog audio signal.

13. The audio playback device of claim 12, wherein the audio receiver module comprises a sound coil having two terminals electrically coupled to the first path, the first temperature sensing circuit is configured to receive a coil current and a coil voltage of the two terminals of the sound coil to compute a coil resistance and compute the temperature according to the coil resistance and a coil temperature coefficient of the sound coil.

14. The audio playback device of claim 13, wherein the first temperature sensing circuit comprises:
- an analog-to-digital converting element to perform an analog-to-digital conversion on the coil current and the coil voltage; and
- a computing element to compute the coil resistance according to the coil current and the coil voltage.

15. The audio playback device of claim 14, further comprising a low frequency signal generation module configured to generate a low frequency signal and transmit the low frequency signal to the audio receiver module through the first path, and the computing element further performs a low-pass filtering on the coil current and the coil voltage after the analog-to-digital conversion to retrieve a part related to the low frequency signal to compute the coil resistance.

16. The audio playback device of claim 11, further comprising a second gain adjusting module disposed corresponding to the second path, wherein the first gain adjusting module and the second gain adjusting module control volumes of the audio receiver module and the loudspeaker module according to a channel volume control signal, and the second gain adjusting module comprises:
- a second temperature sensing circuit configured to sense a loudspeaker temperature of the loudspeaker module; and
- a second gain adjusting circuit electrically coupled between the interface and the loudspeaker module and configured to adjust a second gain of the audio signal according to the loudspeaker temperature of the loudspeaker module.

17. The audio playback device of claim 10, wherein when the temperature is smaller than a threshold temperature, the first gain adjusting module increases the first gain to a predetermined value, and when the temperature is larger than or equal to the threshold temperature, the first gain adjusting module stops to increase the first gain.

18. The audio playback device of claim 10, wherein each of the audio receiver module and the loudspeaker module plays one of a left channel audio signal and a right channel audio signal.

* * * * *